United States Patent
Shinotsuka et al.

(10) Patent No.: US 10,842,019 B2
(45) Date of Patent: Nov. 17, 2020

(54) PRINTED CIRCUIT BOARD AND IMAGE FORMING APPARATUS

(71) Applicant: CANON KABUSHIKI KAISHA, Tokyo (JP)

(72) Inventors: Masahiro Shinotsuka, Sashima-gun (JP); Kazunori Miyake, Kashiwa (JP); Teruhiko Suzuki, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 471 days.

(21) Appl. No.: 15/724,740

(22) Filed: Oct. 4, 2017

(65) Prior Publication Data

US 2018/0103542 A1   Apr. 12, 2018

(30) Foreign Application Priority Data

Oct. 11, 2016 (JP) .................. 2016-199778

(51) Int. Cl.
*H02H 9/00* (2006.01)
*H05K 1/02* (2006.01)
*H05K 7/14* (2006.01)
*G03G 15/00* (2006.01)

(52) U.S. Cl.
CPC .......... *H05K 1/0259* (2013.01); *G03G 15/80* (2013.01); *H05K 1/0215* (2013.01); *H05K 1/0298* (2013.01); *H05K 7/1422* (2013.01)

(58) Field of Classification Search
None
See application file for complete search history.

(56) References Cited

U.S. PATENT DOCUMENTS

| | | | |
|---|---|---|---|
| 9,201,367 B2 | 12/2015 | Miyake | |
| 9,232,105 B2 | 1/2016 | Miyake | |
| 9,348,285 B2 | 5/2016 | Miyake | |
| 9,578,192 B2 | 2/2017 | Miyake | |
| 9,748,155 B2 * | 8/2017 | Nishino | ............ H04B 15/005 |
| 2006/0124348 A1 | 6/2006 | Wang | |

FOREIGN PATENT DOCUMENTS

| | | |
|---|---|---|
| JP | H7-43809 | 2/1995 |
| JP | H09-8417 | 1/1997 |
| JP | 2006-286894 | 10/2006 |
| JP | 2010-109248 | 5/2010 |

OTHER PUBLICATIONS

Japanese Office Action dated May 26, 2020 issued in corresponding Japanese application No. 2016199778 (with English language translation).

* cited by examiner

*Primary Examiner* — Stephen W Jackson
(74) *Attorney, Agent, or Firm* — Venable LLP

(57) ABSTRACT

A printed circuit board for mounting on a support member, the printed circuit board including: a plurality of mounted portions for mounting the printed circuit board on the support member; a ground pattern configured to be electrically connected to the support member through the plurality of mounted portions; and a slit extended from a first mounted portion to a second mounted portion of the plurality of mounted portions and between a first portion, in which an electronic device is provided, of the ground pattern and a second portion, in which an electronic device is not provided, of the ground pattern.

18 Claims, 10 Drawing Sheets

PRINTED CIRCUIT BOARD AND IMAGE FORMING APPARATUS

BACKGROUND OF THE INVENTION

Field of the Invention

The present invention relates to a printed circuit board and an image forming apparatus including a printed circuit board.

Description of the Related Art

In general, an electronic device includes a printed circuit board obtained by coating a conductor pattern, which is formed of a conductive material on a base material, and an electronic element, which is soldered to the conductor pattern, with a layer having an electrical insulating property. In such an electronic device, there is a fear that static electricity charged in, for example, a finger of an operator, may flow into the printed circuit board via a casing of the electronic device to cause damage to an electronic circuit mounted on the printed circuit board. A screw for fixing an exterior member of the casing may also form a route along which the static electricity flows. In view of this, in Japanese Patent Application Laid-Open No. H07-43809, there is disclosed a technology for achieving insulation by increasing a creepage distance between the screw assumed as an intrusion source of the static electricity and each of the printed circuit board and a metal plate. In the electronic device of Japanese Patent Application Laid-Open No. H07-43809, the exterior member and a device main body are fastened by a screw while sandwiching the printed circuit board and the metal plate, and a seat surrounding the screw is formed to have a protruded shape on the exterior member or the device main body, to thereby insulate the screw and the metal plate from each other. This prevents the static electricity from flowing from the screw into the printed circuit board via the metal plate.

However, the seat surrounding the screw, which is described in Japanese Patent Application Laid-Open No. H07-43809, needs to insulate the screw and the metal plate from each other by being formed of a resin material. This leads to a fear that a fastening strength of the screw may be lowered when insertion and removal of the screw are repeatedly performed. In addition, manufacturing cost increases when the seat is formed of a resin material having a high hardness in order to prevent the fastening strength from being lowered.

SUMMARY OF THE INVENTION

Therefore, the present invention has been made in view of the above-mentioned problems with the related art, and provides an electronic device configured to prevent damage from being caused to a printed circuit board due to static electricity, with a low-cost simple structure.

According to one embodiment of the present invention, there is provided a printed circuit board for mounting on a support member, the printed circuit board comprising:
a plurality of mounted portions for mounting the printed circuit board on the support member;
a ground pattern configured to be electrically connected to the support member through the plurality of mounted portions; and
a slit extended from a first mounted portion to a second mounted portion of the plurality of mounted portions and between a first portion, in which an electronic device is provided, of the ground pattern and a second portion, in which an electronic device is not provided, of the ground pattern.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

<Image Forming Apparatus>

Figure 1:
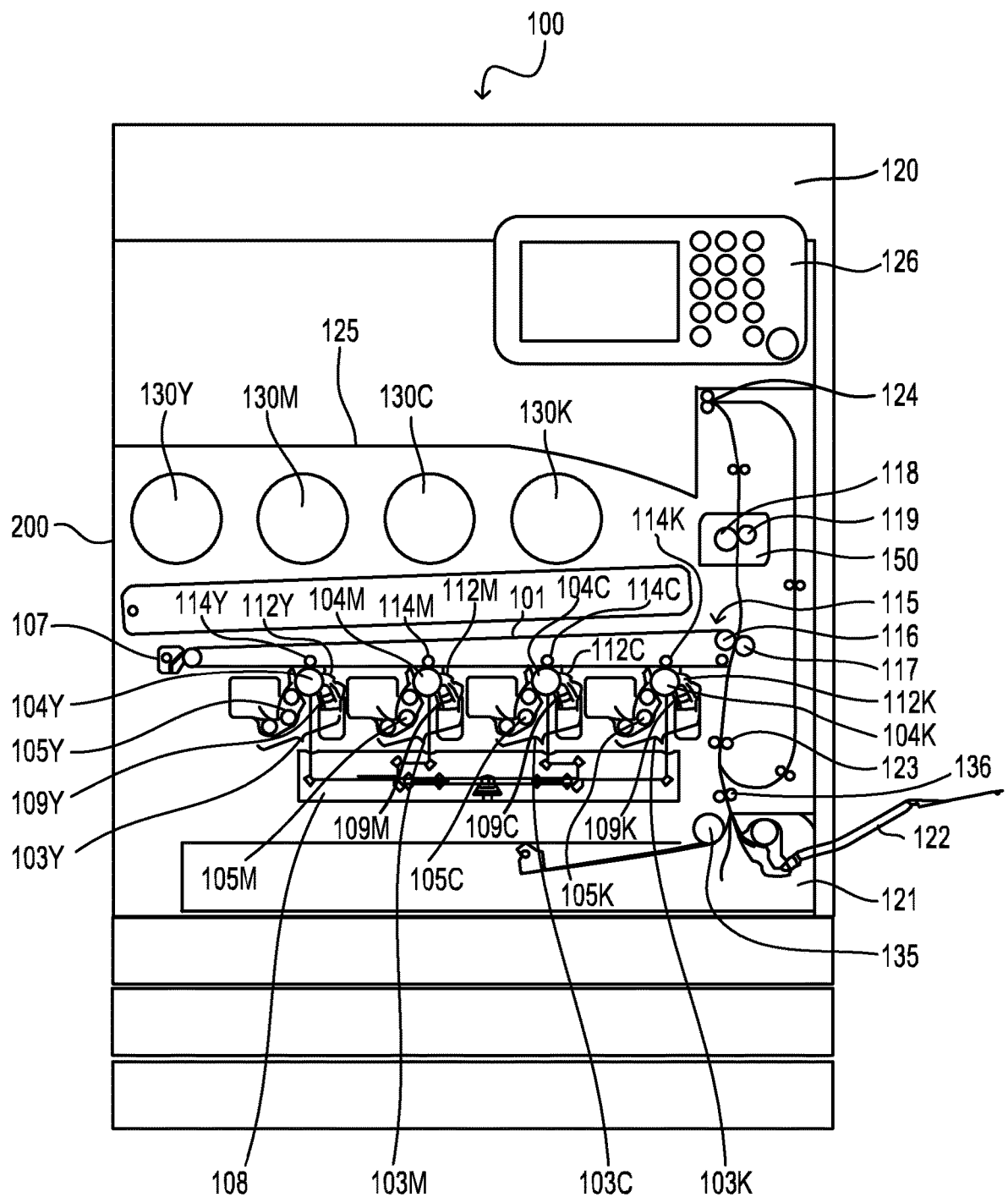
FIG. 1 is an explanatory diagram for illustrating a configuration of an image forming apparatus.

An embodiment will be described below with reference to the accompanying drawings. FIG. 1 is an explanatory diagram for illustrating a configuration of an image forming apparatus 100. The image forming apparatus 100 is configured to form an image on a recording medium through use of an electrophotographic image forming process. Examples of the image forming apparatus 100 include an electrophotographic copying machine (for example, digital copying machine), an electrophotographic printer (for example, color laser beam printer, color LED printer, or the like), a multifunction peripheral (MFP), a facsimile apparatus, and a printing machine. The image forming apparatus 100 is a color image forming apparatus, but may be an image forming apparatus configured to form a monochrome image. The description of the embodiment is directed to only the image forming apparatus 100, but the present invention can be employed as electronic devices having various kinds of configurations that include a printed circuit board.

Figure 2:
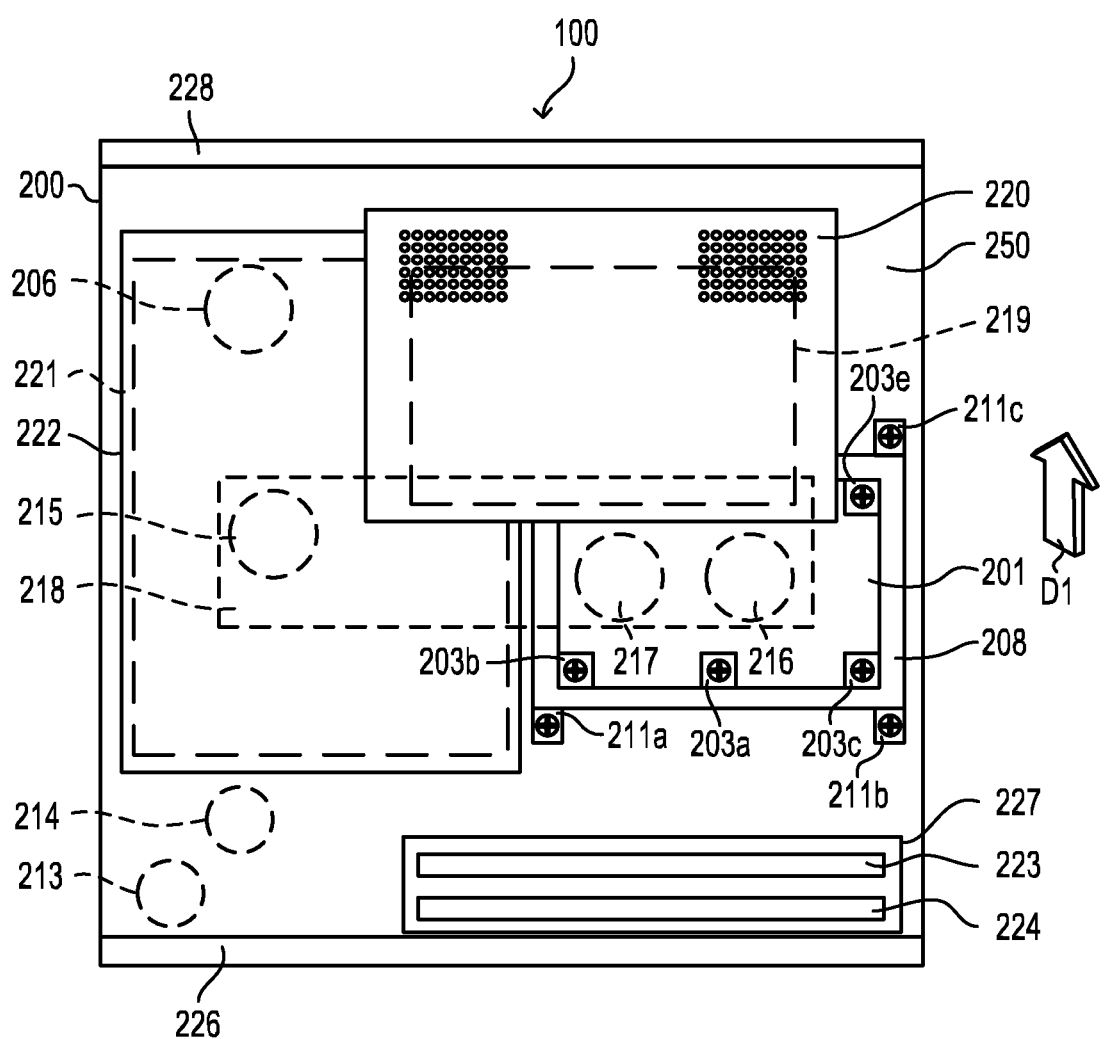
FIG. 2 is a back view of the image forming apparatus.

The image forming apparatus 100 includes an operation unit 126 being a user interface (UI) to be used by a user for performing an operation. The operation unit 126 includes a button to be used by the user for inputting an instruction and a liquid crystal screen (display unit) configured to display information for the user. The image forming apparatus 100 includes an original reading unit 120 configured to read image information on an original. The original reading unit 120 is, for example, an image scanner. The image forming apparatus 100 further includes a sheet storage unit (hereinafter referred to as "feed cassette") 121 configured to store recording paper or other such recording medium (hereinafter referred to as "sheet") on which an image is to be formed. The feed cassette 121 is arranged in a lowermost part of a main body 200 of the image forming apparatus 100 so that a bottom sheet metal 226 made of metal, which is illustrated in FIG. 2, of the main body 200 and the sheet are in parallel with each other. The image forming apparatus 100 is a color image forming apparatus to which toner bottles 130Y, 130M, 130C, and 130K each being a toner container configured to contain toner being a developer are removably attachable.

Process cartridges 103Y, 103M, 103C, and 103K each being an image forming unit are attachably and removably mounted to the main body 200 of the image forming apparatus 100. The process cartridges 103Y, 103M, 103C, and 103K are configured to perform image formation in yellow (Y), magenta (M), cyan (C), and black (K), respectively. Suffixes Y, M, C, and K represent yellow, magenta, cyan, and black, respectively. In the following description, the suffixes Y, M, C, and K may be omitted unless otherwise particularly specified. The process cartridges 103Y, 103M, 103C, and 103K have the same structure. The structure of the process cartridge 103Y will be described below while descriptions of the structures of the other process cartridges 103M, 103C, and 103K are omitted. The process cartridge 103Y includes an electrophotographic photosensitive member (hereinafter referred to as "photosensitive drum") 104Y of a drum type as an image bearing member. A charger 109Y, a developing device 105Y, and a drum cleaner 112Y are arranged around the photosensitive drum 104Y.

The photosensitive drum 104Y includes a photoconductive layer on a drum base member made of aluminum. The photosensitive drum 104Y is rotated by a motor 217 (FIG. 2) as a drive device, so as to achieve a predetermined rotation speed. The charger 109Y is configured to charge a surface of the photosensitive drum 104Y to a predetermined potential having a negative polarity by a charging voltage applied from a transfer charging high voltage board 224. When the photosensitive drum 104Y is scanned by light emitted from a laser exposure device 108 described later while the photosensitive drum 104Y is being rotated, an electrostatic latent image is formed on the photosensitive drum 104Y. The developing device 105Y contains a yellow toner, and is configured to develop (visualize) the electrostatic latent image formed on the photosensitive drum 104Y by causing the yellow toner to adhere to the electrostatic latent image, to thereby generate a yellow toner image. The developing device 105Y is replenished with the yellow toner from the toner bottle 130Y. The drum cleaner 112Y includes a cleaning blade configured to remove a toner remaining on the photosensitive drum 104Y after the yellow toner image on the photosensitive drum 104Y is primarily transferred onto an intermediate transfer belt (intermediate transfer member) 101.

An intermediate transfer belt unit 115 is provided so as to be opposed to the photosensitive drums 104Y, 104M, 104C, and 104K of the process cartridges 103Y, 103M, 103C, and 103K, respectively. The intermediate transfer belt unit 115 includes four primary transfer rollers 114, the intermediate transfer belt 101, a drive roller 116 configured to drive the intermediate transfer belt 101, a belt cleaner 107, and a gear provided to a shaft of the drive roller 116. The drive roller 116 is rotated by a drive gear (not shown) provided to the main body 200. The drive roller 116 is arranged so as to be opposed to a secondary transfer roller 117 across the intermediate transfer belt 101. The drive roller 116 serves as a secondary transfer opposing roller. The intermediate transfer belt 101 is rotated counterclockwise in FIG. 1 by the drive roller 116. The belt cleaner 107 is configured to remove a toner remaining on the intermediate transfer belt 101 after the secondary transfer.

The four primary transfer rollers 114Y, 114M, 114C, and 114K are arranged so as to be opposed to the photosensitive drums 104Y, 104M, 104C, and 104K, respectively. The primary transfer roller 114 is urged toward the photosensitive drum 104. The intermediate transfer belt 101 is sandwiched between the primary transfer roller 114 and the photosensitive drum 104. A fixing device 150 including a fixing roller 118 and a pressure roller 119 is provided on downstream of the secondary transfer roller 117 in a conveyance direction of the sheet. The sheets are fed from the feed cassette 121 or a manual feed tray 122 toward a conveyance path one by one by a feed roller 135. The sheet is conveyed along the conveyance path by draw rollers 136 and registration rollers 123 to be supplied to the fixing device 150. The sheet that has passed through the fixing device 150 is delivered to a delivery tray 125, which is provided on an upper part of the main body 200 of the image forming apparatus 100, by delivery rollers 124. The conveyance path from the feed cassette 121 or the manual feed tray 122 to the delivery rollers 124 is a vertical path.

The laser exposure device 108 is provided below the process cartridges 103Y, 103M, 103C, and 103K. The laser exposure device 108 includes a laser light emitter configured to emit light based on a time-series electric digital pixel signal of the image information. The laser exposure device 108 is configured to expose each photosensitive drum 104 by emitting laser light (light beam) based on image information on each color. With this configuration, the electrostatic latent image corresponding to the image information on each color is formed on the surface of each photosensitive drum 104 uniformly charged by each charger 109.

<Image Forming Operation>

Next, the image forming operation performed by the image forming apparatus 100 will be described. When an instruction to start image formation is input through the operation unit 126, the image forming apparatus 100 reads an original by the original reading unit 120. The read image information (image data) on the original is input to the laser exposure device 108. Meanwhile, when the instruction to start the image formation is input through the operation unit 126, the photosensitive drums 104Y, 104M, 104C, and 104K have the surfaces uniformly charged to a negative polarity by the chargers 109Y, 109M, 109C, and 109K, respectively. The laser exposure device 108 emits the laser light based on the image information on the respective colors input from the original reading unit 120 to form electrostatic latent images of the respective colors on the surfaces of the respective photosensitive drums 104Y, 104M, 104C, and 104K. The developing devices 105Y, 105M, 105C, and 105K cause the toners of the respective colors to adhere to the electrostatic latent images formed on the surfaces of the photosensitive drums 104Y, 104M, 104C, and 104K, respectively, to change the electrostatic latent images to visible images as toner images.

The toner images formed on the respective photosensitive drums 104 are transferred onto the intermediate transfer belt 101 by the photosensitive drums 104 and the primary transfer rollers 114 to which a primary transfer voltage (polarity (positive polarity) reverse to that of the toner) has been applied. The yellow toner image, a magenta toner image, a cyan toner image, and a black toner image are transferred onto the intermediate transfer belt 101 in an order of the process cartridge 103Y, the process cartridge 103M, the process cartridge 103C, and the process cartridge 103K. In this manner, the toner images of the respective colors of yellow, magenta, cyan, and black are superimposed on one another on the intermediate transfer belt 101. The toner remaining on each photosensitive drum 104 after the primary transfer is scraped off by the cleaning blade provided to each drum cleaner 112 to be collected.

The toner images on the intermediate transfer belt 101 are conveyed to a secondary transfer portion between the drive roller (secondary transfer opposing roller) 116 and the secondary transfer roller 117. The sheet is conveyed to the secondary transfer portion from the feed cassette 121 or the manual feed tray 122 at a timing at which the toner images on the intermediate transfer belt 101 are conveyed to the secondary transfer portion. The sheet is conveyed to the secondary transfer portion by the registration rollers 123. The toner images on the intermediate transfer belt 101 are secondarily transferred onto the sheet, which has been conveyed to the secondary transfer portion, collectively by the secondary transfer roller 117 to which a secondary transfer voltage (polarity (positive polarity) reverse to that of the toner) has been applied. The toner remaining on the intermediate transfer belt 101 after the secondary transfer is scraped off by the belt cleaner 107 to be collected as a waste toner.

The sheet to which the toner images have been transferred is conveyed to the fixing device 150. The fixing device 150 heats and pressurizes the toner images transferred onto the sheet by a fixing nip portion between the fixing roller 118 and the pressure roller 119, to thereby fix the toner images to the sheet as a full color image. The sheet on which the image has been formed is delivered to the delivery tray 125 provided on the upper part of the main body 200 of the image forming apparatus 100 by the delivery rollers 124. In this manner, a series of image forming operations is brought to an end.

<Electrical Components on Back Surface>

Figure 3:
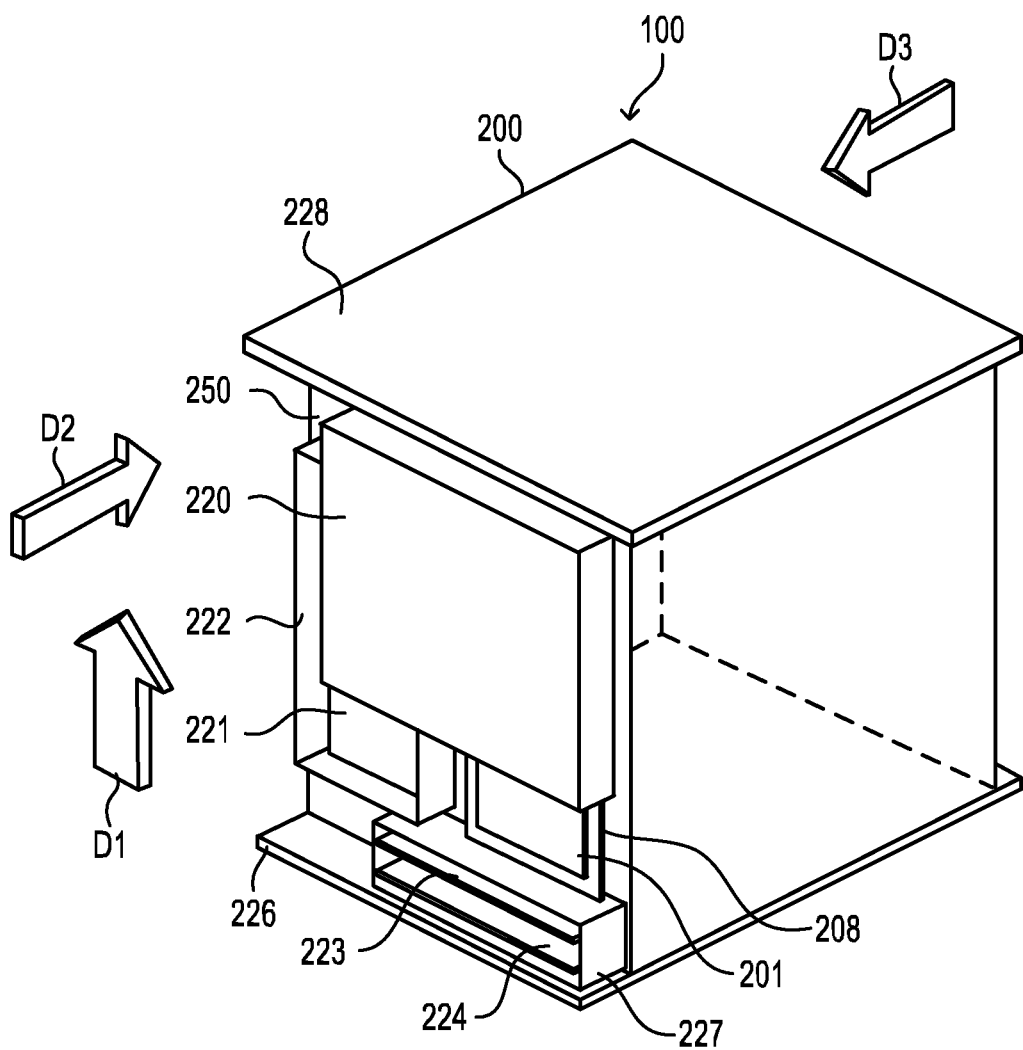
FIG. 3 is a perspective view of the image forming apparatus viewed from a back surface side.

FIG. 2 is a back view of the image forming apparatus 100. FIG. 3 is a perspective view of the image forming apparatus 100 viewed from a back surface side. An arrow D1 represents a vertical direction from the bottom to the top of the image forming apparatus 100. An arrow D2 represents a direction from a back surface to a front surface of the image forming apparatus 100. An arrow D3 represents a direction from the front surface to the back surface of the image forming apparatus 100. In FIG. 2, components that cannot be viewed from the back surface side of the main body 200 of the image forming apparatus 100 are indicated by the broken lines.

A back side plate 250 is provided to the back surface of the image forming apparatus 100. The back side plate 250 has such a proper strength as to be mounted with boards and drive parts (motors) which will be described later. The back side plate 250 is in contact with the bottom sheet metal 226 provided in a bottom part of the image forming apparatus 100 and a top board 228 provided in a top part of the image forming apparatus 100. The back side plate 250 functions as a frame ground by conducting a ground potential in electrical contact with a sheet metal (not shown) and an electroconductive member inside the image forming apparatus 100.

Motors 215, 217, 216, 213, 214, and 206 are provided to the back side plate 250 of the image forming apparatus 100. Each motor is arranged near a component to be driven.

The motor 215 is configured to drive the photosensitive drum 104K and the drive roller 116 of the intermediate transfer belt unit 115. The motor 217 is configured to drive the photosensitive drums 104Y, 104M, and 104C. The motor 216 is configured to drive a developing screw inside each of the developing devices 105Y, 105M, 105C, and 105K. The motors 215, 217, and 216 are integrated as a main drive unit 218 together with a gear configured to drive the photosensitive drum 104 and a gear configured to drive the developing screw. The main drive unit 218 is removably mounted to the main body 200 of the image forming apparatus 100.

The motors 213 and 214 are configured to drive the feed roller 135 and the draw rollers 136, respectively, in order to convey the sheet. As illustrated in FIG. 2, the motors 213 and 214 are arranged near the conveyance path of the sheet on a left side when viewed from the back surface side of the image forming apparatus 100. The motor 213 is configured to drive the feed roller 135. The motor 214 is configured to drive the draw rollers 136 provided on downstream of the feed roller 135 in the conveyance direction. The motor 206 is arranged near the fixing device 150, and is configured to drive at least one of the fixing roller 118 and the pressure roller 119. The back side plate 250 of the image forming apparatus 100 is provided with not only the respective motors described above but also a load control board 201, a power supply board 221, an image control board 219, the transfer charging high voltage board 224, and an image forming high voltage board 223.

The image control board 219 being a printed circuit board is electrically connected to the operation unit 126. The image control board 219 includes a controller configured to control image forming processing. The image control board 219 is arranged in a top right side when viewed from the back surface side of the image forming apparatus 100. The image control board 219 is housed inside an image control board box 220 being a box-shaped sheet metal having an opening on the back surface side of the image forming apparatus 100, and fixed to the image control board box (support member) 220 by a screw. An opening portion of the image control board box 220 is covered by another sheet metal. The image control board box 220 is configured to shield noise radiated from the image control board 219. The image control board box 220 is fixed to the back side plate 250 by a screw, and functions as a frame ground by conducting a ground potential. In order to reduce a wiring length of a wiring connected to the operation unit 126, a connector (not shown) is provided near the top left of the image control board 219 when viewed from the back surface side of the image forming apparatus 100. A connector (not shown) for connection to an external device, a connector (not shown) for a network, and other such connector (not shown) for an external interface are provided on a left-hand side of the image control board 219 when viewed from the back surface side of the image forming apparatus 100.

The power supply board 221 is configured to distribute AC power supplied from a commercial power source, and to convert the AC power into DC power. The power supply board 221 is arranged so as to have the long side in the vertical direction on the left side when viewed from the back surface side of the image forming apparatus 100, and is also arranged at a position closest to a cable configured to supply commercial power. The power supply board 221 is housed inside a power supply box 222 being a box-shaped sheet metal having an opening on the back surface side of the image forming apparatus 100, and fixed to the power supply box 222 by a screw. The power supply box 222 is fixed to the back side plate 250 by a screw, and functions as a frame ground by conducting a ground potential.

The load control board 201 being a printed circuit board includes a controller configured to control operations of various motors and other such load parts and sensors (detectors) that are included in the image forming apparatus 100. The load control board 201 is arranged on a lower side of the image control board 219 in the vertical direction. The load control board 201 is arranged so as to have an upper part overlapped with a lower part of the image control board 219 when viewed from the back surface side of the image forming apparatus 100. The image control board 219 is located on a back side of the load control board 201 with an overlap. The load control board 201 is fixed to a support sheet metal 208 made of metal and serving as a support member by a screw made of metal. The support sheet metal 208 is fixed to the back side plate 250 made of metal by a screw made of metal, and functions as a frame ground by conducting a ground potential.

The transfer charging high voltage board 224 is configured to generate the primary transfer voltage to be applied to the primary transfer roller 114, the secondary transfer voltage to be applied to the secondary transfer roller 117, and the charging voltage to be applied to the charger 109. The transfer charging high voltage board 224 is arranged in a right bottom part of the image forming apparatus 100 when viewed from the back surface side of the image forming apparatus 100. The image forming high voltage board 223 is configured to generate a developing voltage to be applied to the developing device 105. The transfer charging high voltage board 224 and the image forming high voltage board 223 are housed in a high-voltage box 227 being a mold member. The high-voltage box 227 is fixed to the bottom sheet metal 226 by a screw.

The image control board 219 is mounted with a ball grid array (BGA) and an integrated circuit (hereinafter referred to as "IC") having a narrow terminal pitch in order to process a large number of high speed signals, and is therefore formed of a board having a multilayered structure (eight-layer board). The power supply board 221 needs to have a large distance between patterns in order to handle a primary AC voltage and a secondary DC voltage, and is therefore formed of a single-sided (one-layer) board. The load control board 201 is mounted with an IC having a narrow terminal pitch, and is therefore formed of a multilayer printed circuit board (two-layer board). The transfer charging high voltage board 224 and the image forming high voltage board 223 need to have a large distance between patterns in order to handle a high voltage and a control signal of a low voltage, and is therefore formed of a single-sided board. In the embodiment, the image control board 219 and the load control board 201 are separately provided, but may be integrated by matching the number of layers of the image control board 219 with the number of layers of the load control board 201.

Figure 4:
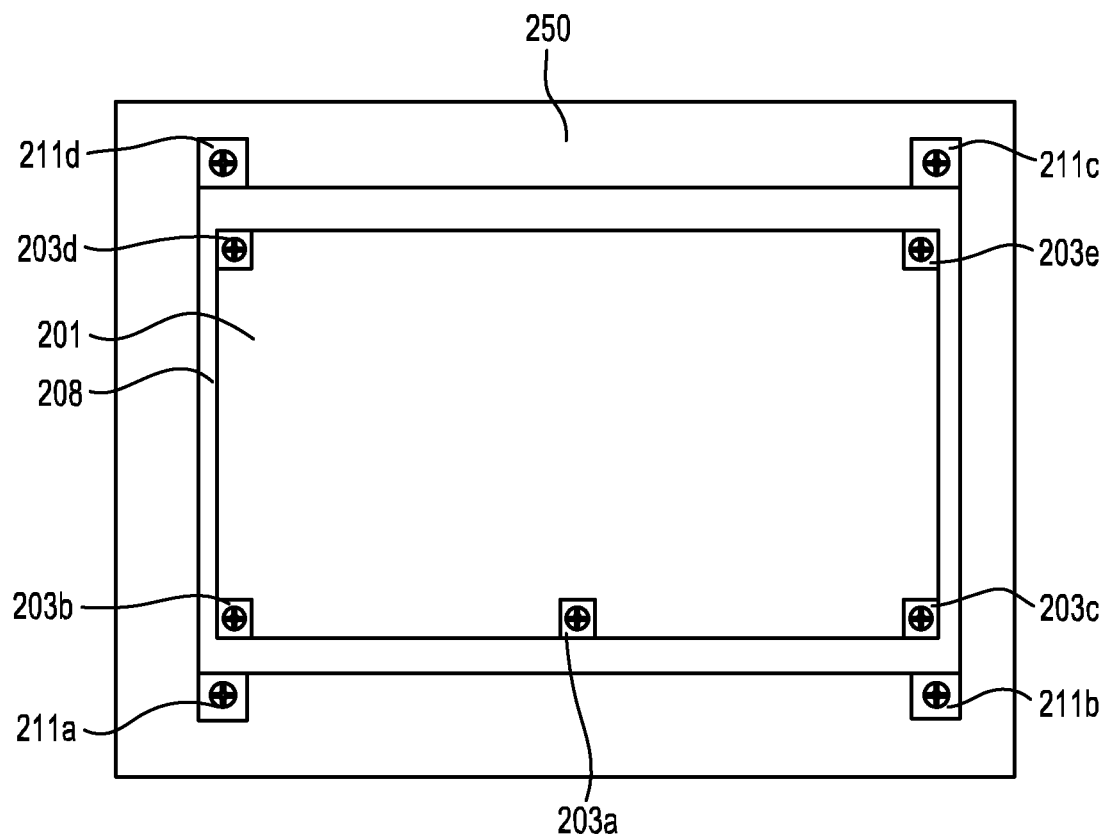
FIG. 4 is a diagram for illustrating a load control board viewed from the back surface side of the image forming apparatus.

FIG. 4 is a diagram for illustrating the load control board 201 viewed from the back surface side of the image forming apparatus 100. The load control board 201 includes a plurality of board mounted portions 203*a*, 203*b*, 203*c*, 203*d*, and 203*e* for fixing the load control board 201 to the support sheet metal 208. A screw hole is formed in each of the board mounted portions 203*a* to 203*e*. The support sheet metal 208 and the load control board 201 are fastened together by screws, and the load control board 201 is thus fixed to the support sheet metal 208. The support sheet metal 208 includes support sheet metal mounted portions 211*a*, 211*b*, 211*c*, and 211*d* for fixing the support sheet metal 208 to the back side plate 250. A screw hole is formed in each of the support sheet metal mounted portions 211*a*, 211*b*, 211*c*, and 211*d*. The back side plate 250 and the support sheet metal 208 are fixed by screws. The support sheet metal 208 is fixed to the back side plate 250 functioning as a frame ground by the screws, and hence the support sheet metal 208 also functions as a frame ground.

Figure 5:
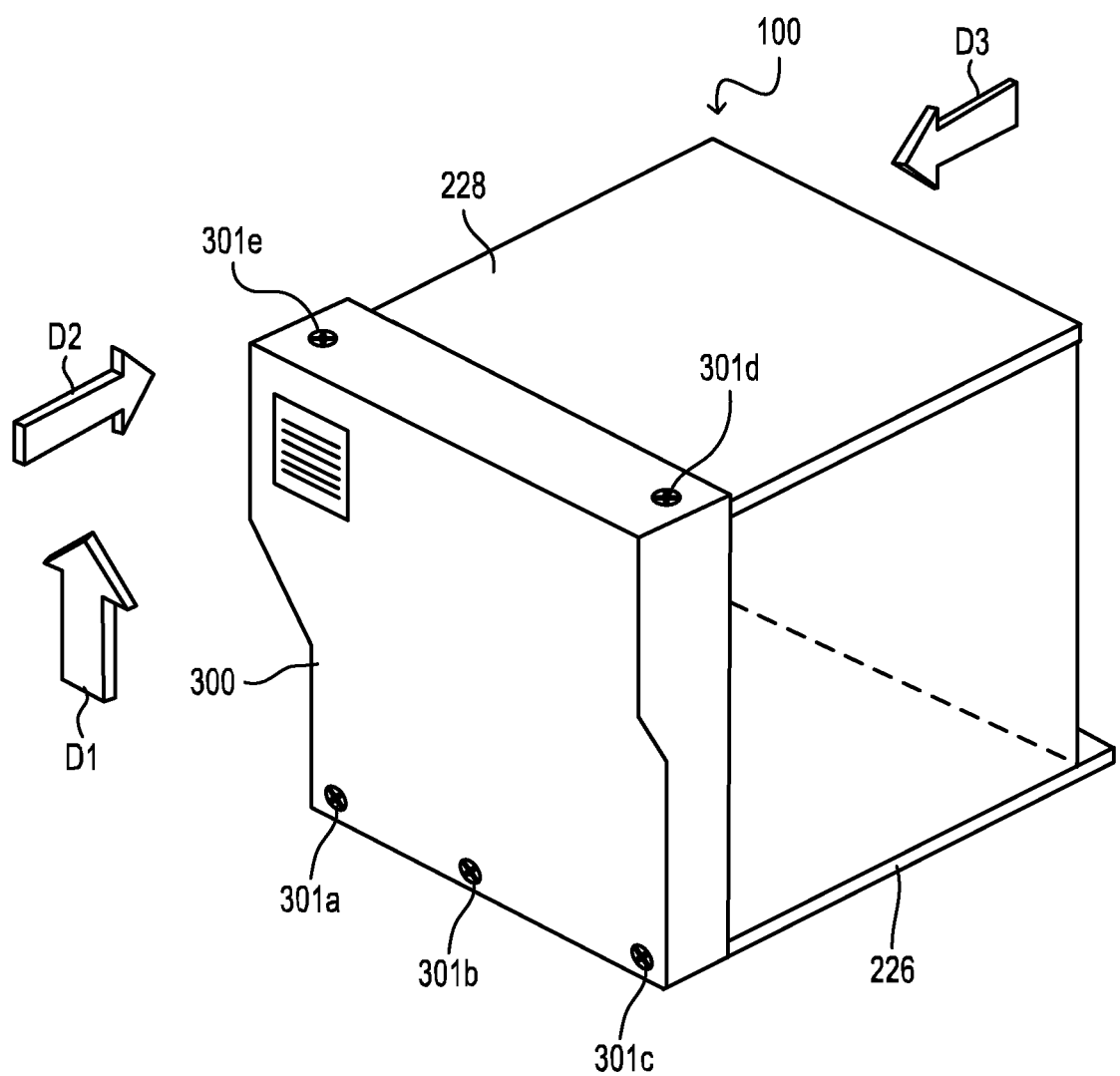
FIG. 5 is a perspective view of the image forming apparatus to which an exterior cover is attached.

FIG. 5 is a perspective view of the image forming apparatus 100 to which an exterior cover 300 is attached. The exterior cover 300 is configured to cover the back surface of the image forming apparatus 100. The exterior cover 300 is fixed to the main body 200 of the image forming apparatus 100 at five points by exterior cover screws 301*a*, 301*b*, 301*c*, 301*d*, and 301*e*. The exterior cover screws 301*d* and 301*e* are provided at two points in an upper right part and an upper left part, respectively, of the image forming apparatus 100. The exterior cover 300 is fixed to the top board 228 by the exterior cover screws 301*d* and 301*e* from the top to the bottom in the vertical direction of the image forming apparatus 100. The exterior cover screws 301*a*, 301*b*, and 301*c* are provided at three points in a lower left part, a lower central part, and a lower right part, respectively, of the image forming apparatus 100. The exterior cover 300 is fixed to the bottom sheet metal 226 by the exterior cover screws 301*a*, 301*b*, and 301*c* in the direction D2 from the back surface to the front surface of the image forming apparatus 100.

<Load Control Board>

Figure 6A:
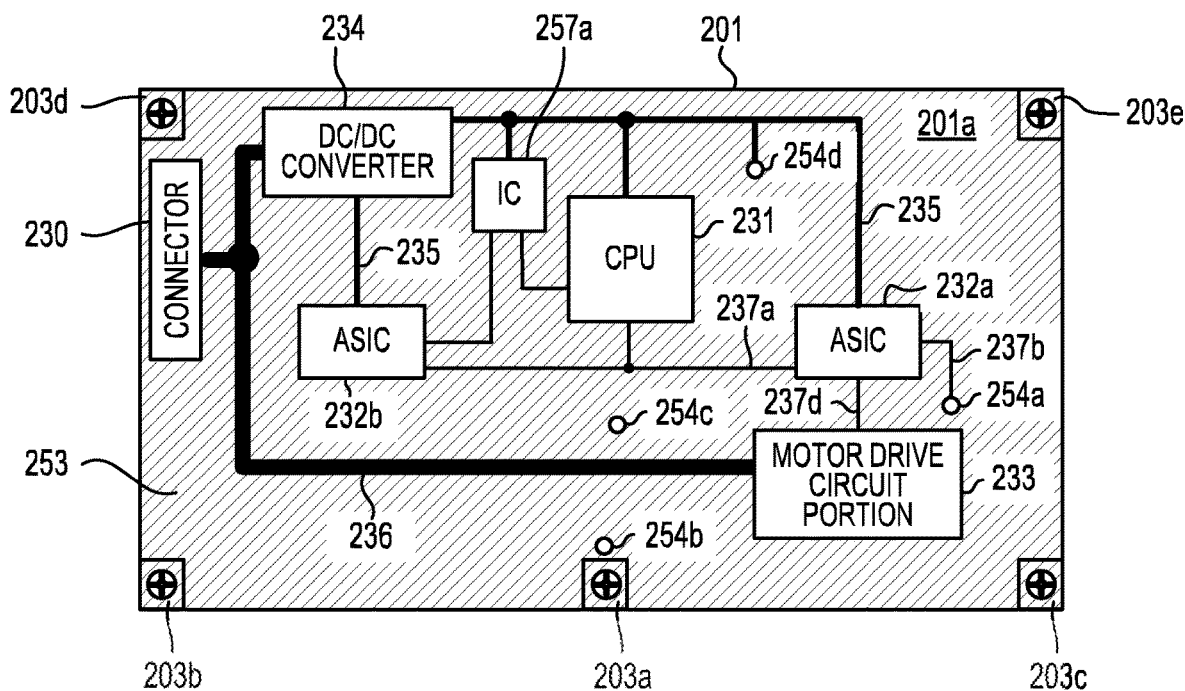
FIG. 6A and FIG. 6B are diagrams for illustrating wiring patterns of the load control board.
Figure 6B:
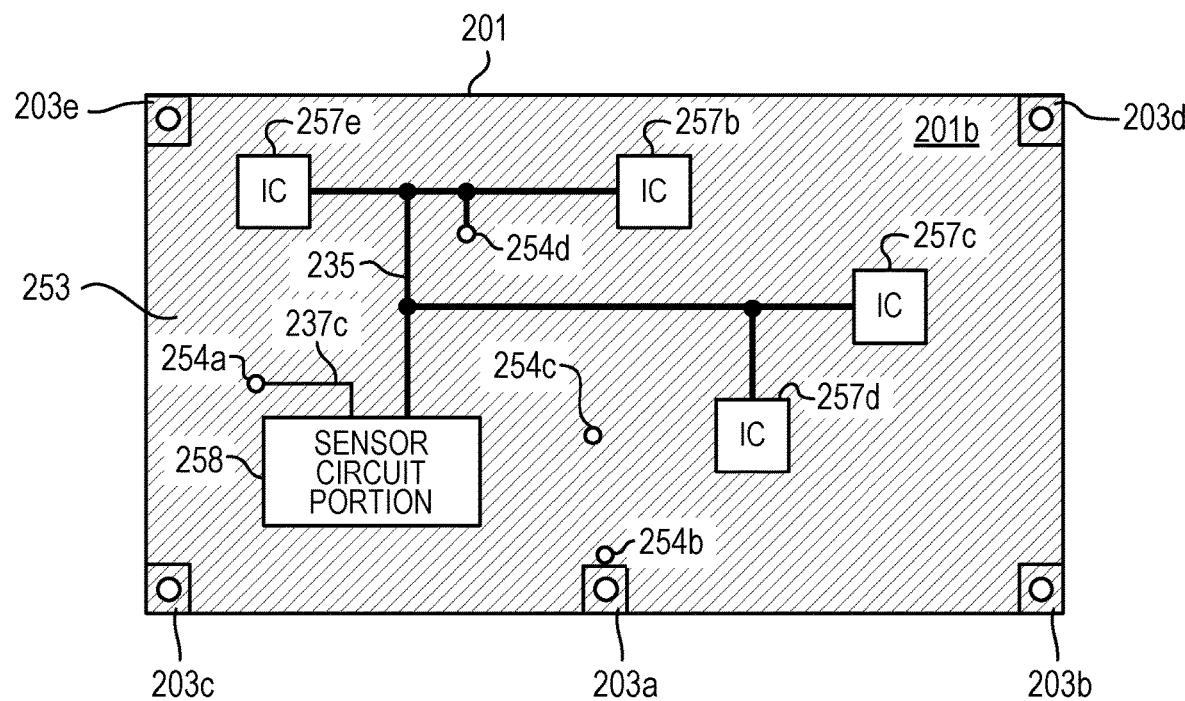

Next, wiring patterns on the load control board 201 will be described with reference to FIG. 6A and FIG. 6B. FIG. 6A and FIG. 6B are diagrams for illustrating the wiring patterns on the load control board 201. FIG. 6A is the diagram for illustrating a pattern of a component surface 201*a* of the load control board 201. FIG. 6B is the diagram for illustrating a pattern of a solder surface 201*b* of the load control board 201. The load control board 201 is arranged so that the component surface 201*a* is directed toward the back surface side of the image forming apparatus 100 and the solder surface 201*b* is directed toward the front surface side of the image forming apparatus 100. A central processing unit (hereinafter referred to as "CPU") 231 and application-specific integrated circuits (hereinafter referred to as "ASICs") 232 (232*a* and 232*b*) are provided on the component surface 201*a* of the load control board 201. A signal pattern 237*a* is provided in order to connect the CPU 231 and the ASICs 232*a* and 232*b* to each other. The ASIC 232*a* is configured to drive the motors 215 and 217 inside the image forming apparatus 100 via a motor drive circuit portion 233. A signal pattern 237*d* is configured to connect between the ASIC 232*a* and the motor drive circuit portion 233. The signal patterns 237*a* and 237*d* are formed of copper foil or other such conductor. The signal pattern 237*d* between the ASIC 232*a* and the motor drive circuit portion 233 is merely an example, and the illustration does not include all signal patterns. For example, a signal pattern may be provided in order to connect an IC 257*a* to an IC 257*e* (for example, general-purpose logic IC) to a sensor circuit portion 258 or other such circuit. A large number of signal patterns exist within the load control board 201.

The load control board 201 includes not only the signal patterns 237*a* to 237*d* but also a power supply pattern 236 for the DC voltage of 24 V being a power supply to a motor load inside the image forming apparatus 100. The power supply pattern 236 is also formed of copper foil or other such conductor in the same manner as the signal pattern 237. The DC voltage of 24 V is supplied from the power supply board 221 to a connector 230 of the load control board 201 through a cable (not shown). The DC voltage of 24 V is supplied from the connector 230 to the motor drive circuit portion 233 and a DC/DC converter 234 through the power supply pattern 236. The power supply pattern 236 has a pattern width corresponding to a capacity of a current to be consumed by the motor load. The DC/DC converter 234 is configured to convert the DC voltage of 24 V into a logic voltage. The DC/DC converter 234 functions as a power supply to the sensor circuit portion 258, the CPU 231, the ASIC 232a, the ASIC 232b, and the IC 257a to the IC 257e. The logic voltage generated by the DC/DC converter 234 is supplied to the sensor circuit portion 258, the CPU 231, the ASIC 232a, the ASIC 232b, and the IC 257a to the IC 257e through a logic power supply pattern 235. The logic power supply pattern 235 is also formed of copper foil or other such conductor.

A ground pattern 253 is provided to space of the load control board 201 on which mounting components or wiring patterns are not provided. The mounting components include the CPU 231, the ASICs 232, the motor drive circuit portion 233, the IC 257, and the sensor circuit portion 258. The wiring patterns include the signal pattern 237, the power supply pattern 236, and the logic power supply pattern 235. The mounting components and the wiring patterns form an electronic circuit. The ground pattern 253 is provided on both the component surface 201a and the solder surface 201b so as to occupy a large part of the area of the load control board 201. The diagonally shaded parts of FIG. 6A and FIG. 6B indicate the ground pattern 253. The ground pattern 253 is also provided on the board mounted portions 203a to 203e on the component surface 201a and the solder surface 201b. The ground pattern 253 is also formed of copper foil or other such conductor in the same manner as the signal pattern 237, the power supply pattern 236, and the logic power supply pattern 235.

The load control board 201 is provided with a plurality of through holes 254 (254a, 254b, 254c, and 254d). The through hole 254 is a hole having a conductor arranged inside in order to connect the pattern on the component surface 201a and the pattern on the solder surface 201b to each other on the multilayer printed circuit board. The through hole 254a located in the lower right part of the load control board 201 in FIG. 6A is configured to conduct electricity between a signal pattern 237b from the ASIC 232a on the component surface 201a and a signal pattern 237c to the sensor circuit portion 258 on the solder surface 201b illustrated in FIG. 6B. The through hole 254b located in the lower central part of the load control board 201 and the through hole 254c located in the central part of the load control board 201 are configured to conduct electricity between the ground pattern 253 on the component surface 201a and the ground pattern 253 on the solder surface 201b. The through hole 254d is configured to conduct electricity between the logic power supply pattern 235 on the component surface 201a and the logic power supply pattern 235 on the solder surface 201b. A large number of through holes 254, which are not illustrated in FIG. 6A and FIG. 6B, conduct electricity between the wiring pattern on the component surface 201a and the wiring pattern on the solder surface 201b.

The signal pattern 237, the power supply pattern 236, the logic power supply pattern 235, and the ground pattern 253 that are provided on the load control board 201 are coated with a layer having an electrical insulating property (electrical insulating layer). However, the ground pattern 253 on the board mounted portions 203a to 203e on the component surface 201a side is not coated with the electrical insulating layer. The ground pattern 253 on the board mounted portions 203a to 203e on the solder surface 201b side is conducted to the ground potential of the frame ground by being in contact with the support sheet metal 208. The ground pattern 253 is electrically connected to the support sheet metal 208 through the board mounted portions 203a to 203e. This can stabilize the ground potential of the ground pattern 253 on the load control board 201, to thereby reduce a risk of radiating noise from the load control board 201. Further, the CPU 231 and the ASICs 232 are mounted on the component surface 201a, but may be mounted on the solder surface 201b.

<Slit on Load Control Board>

Figure 7A:
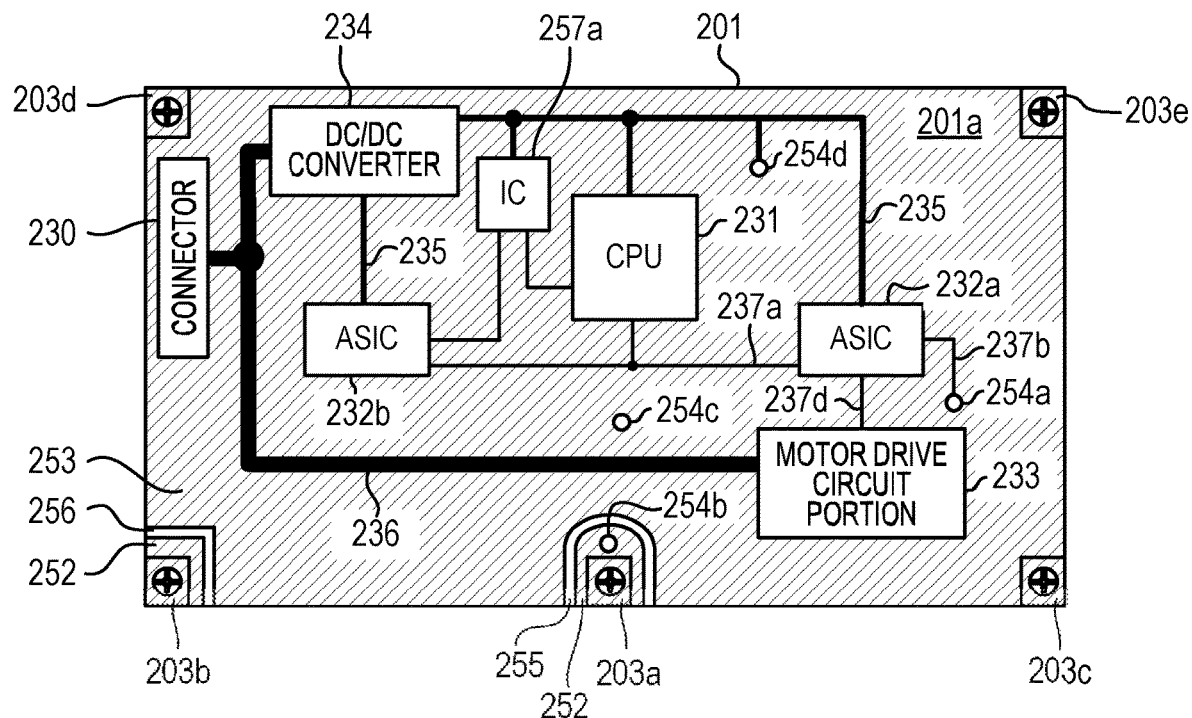
FIG. 7A and FIG. 7B are diagrams for illustrating the wiring patterns of the load control board provided with slits.
Figure 7B:
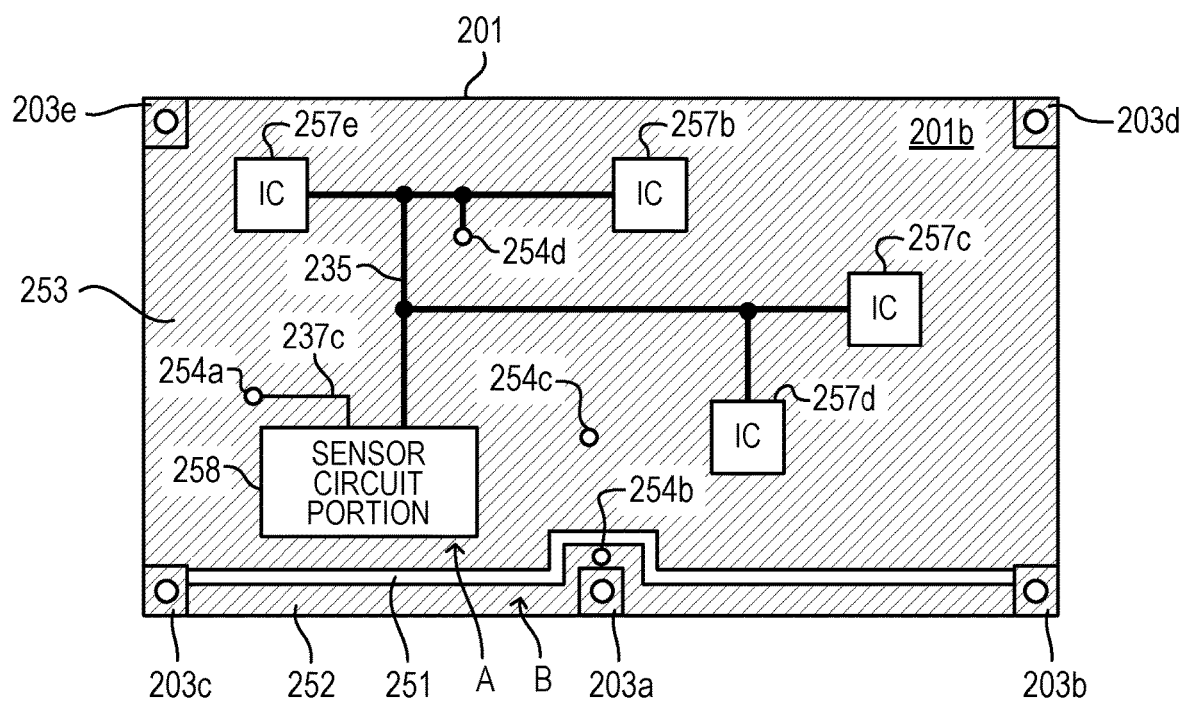

Next, gap portions (hereinafter referred to as "slits") 251, 255, and 256, which are provided as a countermeasure against electrostatic intrusion into the load control board 201, will be described with reference to FIG. 7A and FIG. 7B. FIG. 7A and FIG. 7B are diagrams for illustrating the wiring patterns on the load control board 201 provided with the slits 251, 255, and 256. FIG. 7A is the diagram for illustrating the wiring pattern on the component surface 201a provided with the slits 255 and 256. FIG. 7B is the diagram for illustrating the wiring pattern on the solder surface 201b provided with the slit 251. The component surface 201a and the solder surface 201b of the load control board 201 are provided with not only the signal pattern 237, the power supply pattern 236, and the logic power supply pattern 235 but also the ground pattern 253 on a substantially entire surface of space including no mounting component. The board mounted portions 203a to 203e are also provided with the ground pattern 253. The slits 255 and 256 are provided to a part of the ground pattern 253 on the component surface (second surface) 201a within the load control board 201. The slit 251 is provided to a part of the ground pattern 253 on the solder surface (first surface) 201b opposite to the component surface 201a. The slits 251, 255, and 256 each have a substantially fixed width over an entire length of each of the slits 251, 255, and 256. In the embodiment, the slits 251, 255, and 256 each have a width of 2.0 mm. Each of the slits 251, 255, and 256 does not necessarily need to have a fixed width over its entire length, and the width may change as long as each of the slits 251, 255, and 256 has a width equal to or larger than a predetermined width. Each of the slits 251, 255, and 256 may simply be a gap portion in which the ground pattern 253 is not formed, or may be a gap portion formed as a groove opening.

The slit 251 on the solder surface 201b extends so as to connect between the board mounted portions 203b and 203c on the load control board 201, to thereby separate a part of the ground pattern 253 as a ground pattern 252. The slit 251 extends from one board mounted portion 203b to another board mounted portion 203c and between a first portion A, in which the electronic circuit is provided, and a second portion B, in which the electronic circuit is not provided, of the ground pattern 253. The slit 251 is provided to a part of the ground pattern 253 without dividing the ground pattern 253 into two. That is, the first portion A of the ground pattern 253 and the second portion B (ground pattern 252) of the ground pattern 253 are continuously connected to each other through the board mounted portions 203b and 203c. The slit 251 is provided on the solder surface 201b so as to pass through the inner side on the load control board 201 than the board mounted portion 203a and the through hole 254b that are provided between the board mounted portions 203b and 203c. However, the ground pattern 253 is not separated from the ground pattern 252 in the board mounted portions 203b and 203c, and the ground potential is conducted between the ground patterns 252 and 253. With this configuration, the ground potential of the ground pattern 253 within the load control board 201 is maintained at the ground potential of the support sheet metal 208. In short, the ground potential of the frame ground is conducted to the ground pattern 253 on the load control board 201 provided with the slit 251, which inhibits the stability of the ground potential of the ground pattern 253 from being impaired. Therefore, it is possible to reduce the risk of radiating noise from the load control board 201.

The slit 255 on the component surface 201a surrounds the board mounted portion 203a and the through hole 254b to separate a part of the ground pattern 253 on the component surface 201a as the ground pattern 252. The slit 256 on the component surface 201a surrounds the board mounted portion 203b to separate a part of the ground pattern 253 on the component surface 201a as the ground pattern 252. The slit 255 and the slit 256 separate two ground patterns 252 from the ground pattern 253. However, the board mounted portions 203a and 203b on the solder surface 201b are in contact with the support sheet metal 208 serving as the frame ground, and hence the two ground patterns 252 on the component surface 201a maintain a state of being conducted to the ground potential of the frame ground. In the embodiment, the slits 251, 255, and 256 each has a width of 2.0 mm, but the width of each of the slits 251, 255, and 256 needs to be changed depending on an applied voltage of static electricity to be avoided, and is not necessarily limited to 2.0 mm. Examples of the width of each of the slits 251, 255, and 256 may include 1.5 mm, 1.8 mm, 2.2 mm, and 2.5 mm.

<Discharge Route>

Figure 8:
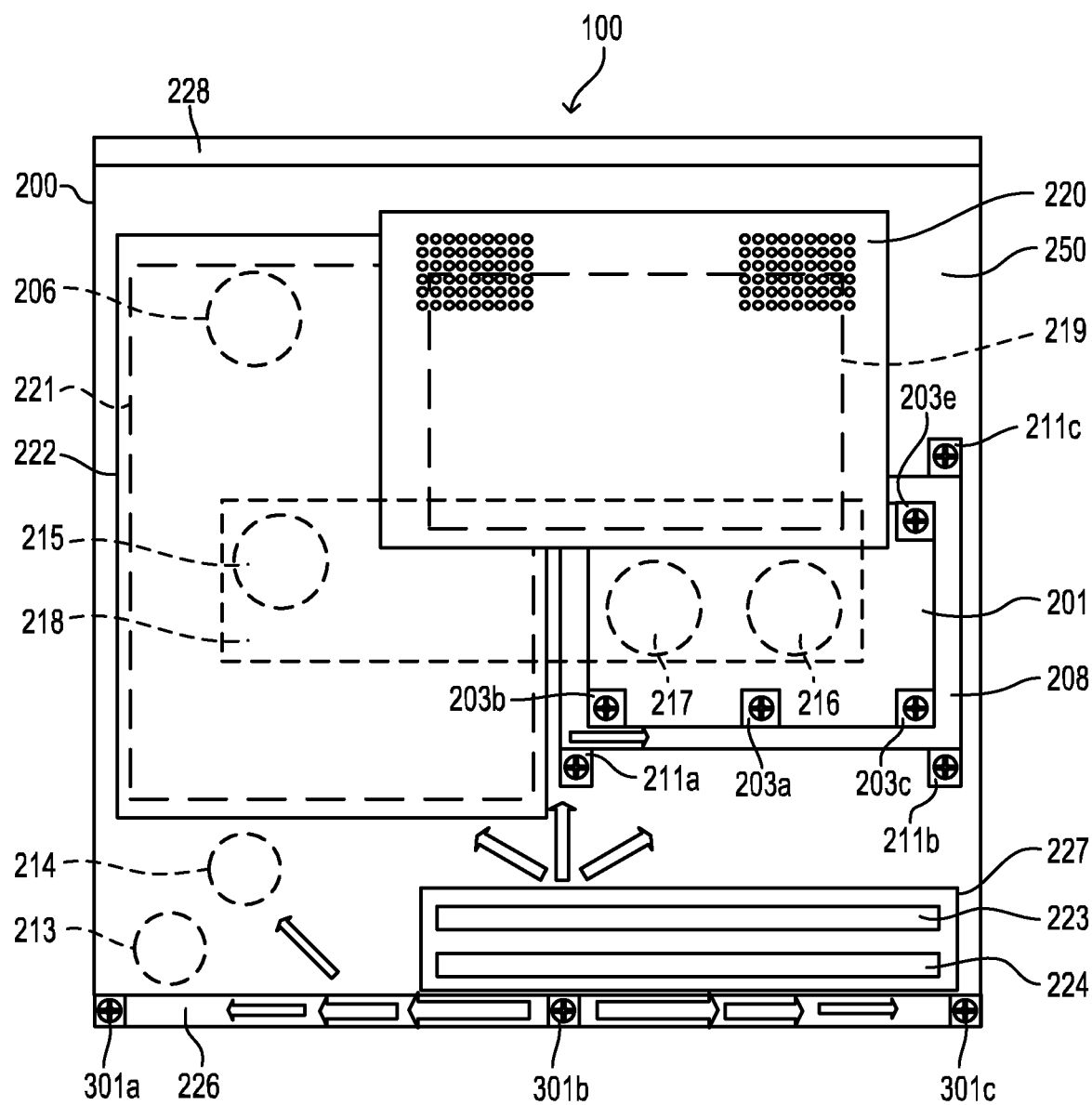
FIG. 8 is a diagram for illustrating an electrostatic discharge route on a back surface of the image forming apparatus.

Next, a discharge route exhibited when static electricity intrudes into the image forming apparatus 100 will be described. FIG. 8 is a diagram for illustrating an electrostatic discharge route on the back surface of the image forming apparatus 100. FIG. 8 is an illustration of the discharge route of static electricity that has intruded from the exterior cover screw 301b. The arrows illustrated in FIG. 8 each represent a direction of a discharge current of the static electricity, and the size of each arrow indicates the magnitude of the discharge current. The exterior cover screw 301b is fastened to the bottom sheet metal 226 provided in the bottom part of the image forming apparatus 100, and hence the discharge current of the static electricity applied to the exterior cover screw 301b flows into the bottom sheet metal 226. The discharge current that has flowed into the bottom sheet metal 226 flows into the back side plate 250 connected to the bottom sheet metal 226 as the frame ground. The discharge current flows into the support sheet metal 208 fixed to the back side plate 250 by the screws in the support sheet metal mounted portions 211a, 211b, 211c, and 211d. The discharge current also flows into the load control board 201 conducting the ground potential to the support sheet metal 208 serving as the frame ground. However, the largest discharge current is exhibited at a spot at which the static electricity has intruded, and the discharge current attenuates more at a spot farther from the intrusion spot due to an impedance of the sheet metal. Although not shown, the discharge current of static electricity that has intruded from the other exterior cover screw 301a, 301c, or 301d flows into the sheet metal around the screw at the intrusion spot in a similar manner, and also flows into the boards (for example, the power supply board 221 and the image control board 219) conducting the ground potential to the frame ground.

Figure 9:
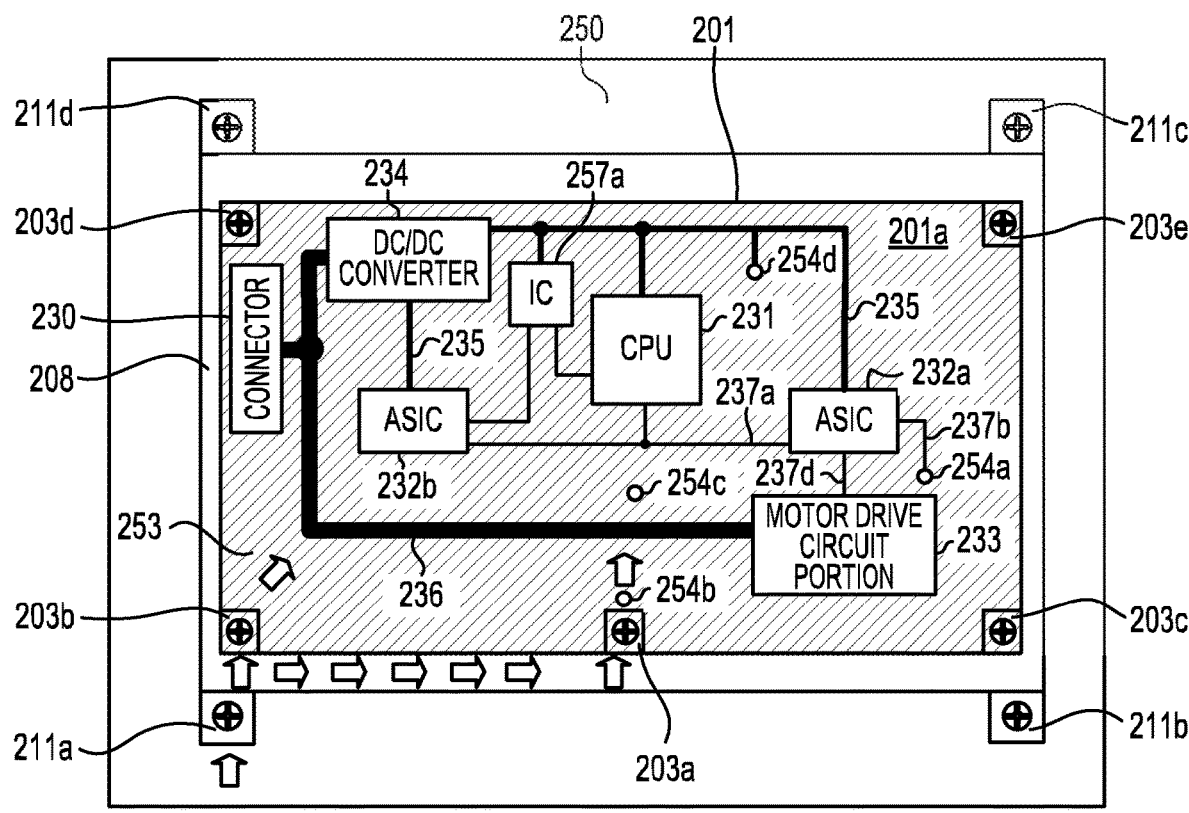
FIG. 9 is a diagram for illustrating an electrostatic discharge route on the load control board provided with no slit.

FIG. 9 is a diagram for illustrating an electrostatic discharge route on the load control board 201 on which the slit 251, 255, or 256 is not provided. FIG. 9 is an illustration of the component surface 201a of the load control board 201 exhibited when the image forming apparatus 100 is viewed from the back surface side. The arrows illustrated in FIG. 9 each represent a route of the discharge current of the static electricity. The discharge current of the static electricity that has intruded from the support sheet metal mounted portion 211a into the support sheet metal 208 intrudes from the board mounted portions 203a and 203b on the load control board 201, which are in contact with the support sheet metal 208, into the ground pattern 253 on the solder surface 201b. The discharge current that has intruded from the ground pattern 253 on the solder surface 201b intrudes into the ground pattern 253 on the component surface 201a via the screw and the through hole 254b. The ground potential within the load control board 201 may instantaneously fluctuate due to the discharge current that has intruded into the ground pattern 253 to cause a malfunction of the CPU 231, the ASICs 232, or the like.

Figure 10A:
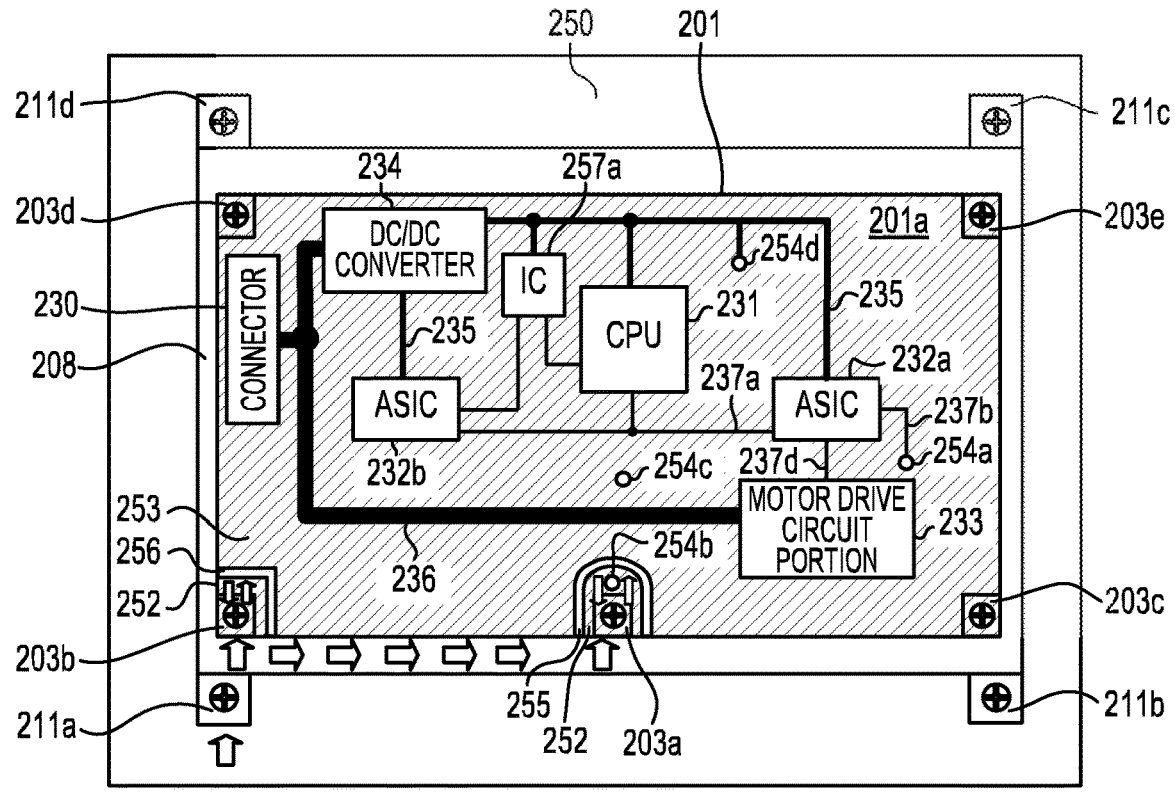
FIG. 10A and FIG. 10B are diagrams for illustrating electrostatic discharge routes on the load control board provided with the slits.
Figure 10B:
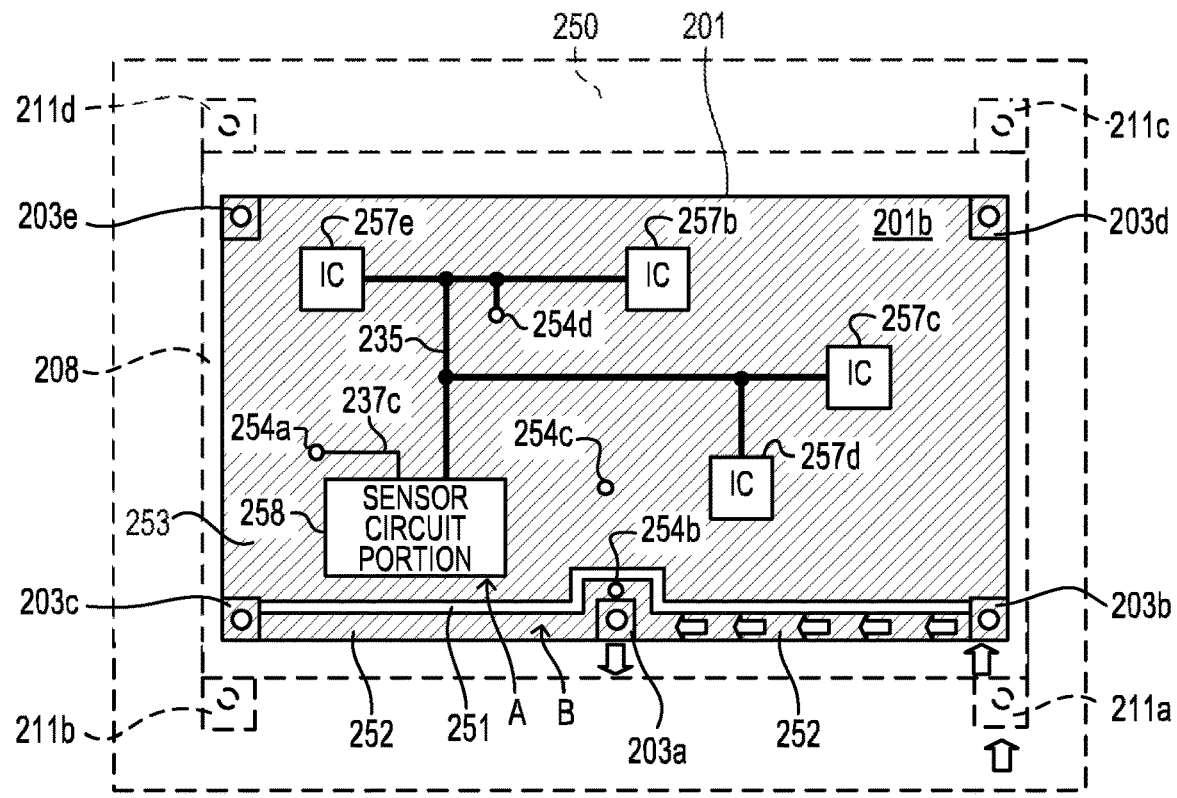

FIG. 10A and FIG. 10B are diagrams for illustrating electrostatic discharge routes on the load control board 201 provided with the slits 251, 255, and 256. FIG. 10A is an illustration of the route of the discharge current of static electricity that has intruded into the component surface 201a provided with the slits 255 and 256. FIG. 10B is an illustration of the route of the discharge current of static electricity that has intruded into the solder surface 201b provided with the slit 251. The arrows illustrated in FIG. 10A and FIG. 10B each represent the route of the discharge current of the static electricity. As illustrated in FIG. 10B, the discharge current of the static electricity that has intruded from the support sheet metal mounted portion 211a into the support sheet metal 208 intrudes from the board mounted portion 203b on the load control board 201, which is in contact with the support sheet metal 208, into the ground pattern 253 on the solder surface 201b. The board mounted portion 203b is an intrusion source (noise intrusion source) from which the discharge current of the static electricity intrudes into the load control board 201. The discharge current of the static electricity flows into a portion having a lower impedance, and therefore flows into the ground pattern 252 separated by the slit 251. This is because a larger ground exhibiting a lower impedance is obtained when the discharge current flows into the frame ground of the support sheet metal 208 through the ground pattern 252 than when the discharge current flows into the ground pattern 253 provided to the space of the load control board 201 on which wiring patterns or mounting components are not provided.

Therefore, the discharge current that has intruded from the board mounted portion 203b passes through the ground pattern 252 on the solder surface 201b illustrated in FIG. 10B to flow from the board mounted portion 203a into the support sheet metal 208 serving as the frame ground. Even when the discharge current intrudes from the ground pattern 252 on the solder surface 201b into the ground pattern 252 on the component surface 201a via the screw and the through hole 254b, the discharge current does not intrude into the ground pattern 253 on the component surface 201a. As illustrated in FIG. 10A, the slits 255 and 256 are provided so as to surround the board mounted portions 203a and 203b, and hence the discharge current that has flowed into the ground pattern 252 on the component surface 201a does not intrude into the ground pattern 253 on the component surface 201a. The discharge current that has flowed into the ground pattern 252 on the component surface 201a flows into the support sheet metal 208 via the screw or the through hole 254b.

In the embodiment, a slit is not provided around the board mounted portion 203c on the component surface 201a. When there is no through hole around the board mounted portion 203c and a distance between the screw in the board mounted portion 203c and the wiring pattern is sufficiently large, a route along which the discharge current from the solder surface 201b intrudes into the wiring pattern on the component surface 201a is hardly formed. This eliminates the need for providing a slit on the component surface 201a around the board mounted portion 203c. In the embodiment, the route along which the discharge current of the static electricity has intruded from the board mounted portion 203b into the load control board 201 is described. However, the same effect is produced when the discharge current of the static electricity intrudes from a lower side of the image forming apparatus 100 into the board mounted portion 203a or 203c as well.

According to the embodiment, the slits 251, 255, and 256 are provided on the load control board 201, and hence it is possible to prevent the discharge current from intruding into the wiring pattern on the load control board 201 even when the discharge current of the static electricity intrudes into the image forming apparatus 100. This can prevent a malfunction from being caused when the discharge current intrudes into the wiring pattern.

In the embodiment, the slit 251 is provided so as to connect between the board mounted portions 203b and 203c on the load control board 201 with the exterior cover screw 301b being assumed as a noise intrusion source, but the position of the slit needs to be changed depending on the noise intrusion source. For example, the slit 251 may be provided so as to connect between the board mounted portions 203d and 203e. In the embodiment, the slits 251, 255, and 256 are provided within the load control board 201, but may be provided to any printed circuit board arranged inside the image forming apparatus 100 instead of the load control board 201.

According to the embodiment, it is possible to prevent damage from being caused to the printed circuit board due to the static electricity, with the low-cost simple structure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-199778, filed Oct. 11, 2016, which is hereby incorporated by reference herein in its entirety.

What is claimed is:

1. A printed circuit board, comprising:
   an electric part;
   a conductive layer provided on a predetermined surface on which the electric part is mounted;
   a first portion through which a first through hole for screw-clamping is formed; and
   a second portion through which a second through hole for screw-clamping is formed,
   wherein the conductive layer includes a ground conductor which is used for grounding the electric part and a separate conductor which is provided around the first through hole on the predetermined surface,
   wherein a gap area is formed between the separate conductor and another conductor including the ground conductor in the conductive layer, and
   wherein an area on which the ground conductor is provided includes an area around the second through hole on the predetermined surface.

2. The printed circuit board according to claim 1, wherein the printed circuit board comprises a two-layer board.

3. An image forming apparatus that forms an image on a recording medium, the image forming apparatus comprising:
   a printed circuit board supported to a support member with screws,
   wherein the printed circuit board includes:
   an electric part;
   a conductive layer provided on a predetermined surface on which the electric part is mounted;
   a first portion through which a first through hole for screw-clamping is formed; and
   a second portion through which a second through hole for screw-clamping is formed,
   wherein the conductive layer includes a ground conductor which is used for grounding the electric part and a separate conductor which is provided around the first through hole on the predetermined surface,
   wherein a gap area is formed between the separate conductor and another conductor including the ground conductor in the conductive layer, and
   wherein an area on which the ground conductor is provided includes an area around the second through hole on the predetermined surface.

4. The printed circuit board according to claim 1, further comprising an insulation layer that coats the conductive layer,
   wherein on the predetermined surface, an area around the first through hole is not coated with the insulation layer, and
   wherein on the predetermine surface, the area around the second through hole is not coated with the insulation layer.

5. The printed circuit board according to claim 1, further comprising:
   another electric part mounted on a back surface different from the predetermined surface and
   another conductive layer mounted on the back surface,
   wherein the another conductive layer includes another ground conductor which is used for grounding the another electric part, and
   wherein an area on which the anther ground conductor is provided includes an area around the first through hole on the back surface and an area around the second through hole on the back surface.

6. The printed circuit board according to claim 1, further comprising:
   another electric part mounted on a back surface different from the predetermined surface; and
   another conductive layer mounted on the back surface,
   wherein the another conductive layer includes a conductive pattern configured to supply a power source voltage to the another electric part and another ground conductor which is used for grounding the another electric part,
   wherein an area on which the another ground conductor is provided includes an area around the first through hole on the back surface and an area around the second through hole on the back surface, and
   wherein the another ground conductor is provided with a slit formed between the first through hole and the conductive pattern on the back surface.

7. The printed circuit board according to claim 1, further comprising:
   another electric part mounted on a back surface different from the predetermined surface; and
   another conductive layer provided on the back surface, wherein the another conductive layer includes a conductive pattern configured to supply a power source voltage to the another electric part and another ground conductor which is used for grounding the another electric part, wherein an area on which the another ground conductor is provided includes an area around the first through hole on the back surface and an area around the second through hole on the back surface, wherein the another ground conductor is provided with a slit formed between the first through hole and the conductive pattern on the back surface, and wherein on the back surface, the first through hole is located between another through hole for screw-clamping formed on the back surface and another through hole for screw-camping formed on the back surface in a longitudinal direction of the slit.

8. The printed circuit board according to claim 1, further comprising a third portion through which a third through hole for screw-clamping is formed, wherein the conductive layer further includes another separate conductor provided around the third through hole on the predetermined surface, and wherein another gap area is formed between the another separate conductor and the another conductor.

9. The printed circuit board according to claim 1, further comprising:

a third portion through which a third through hole for screw-clamping is formed;

another electric part mounted on a back surface different from the predetermined surface; and another conductive layer mounted on the back surface, wherein the conductive layer further includes another separate conductor provided around the third through hole on the predetermined surface, wherein another gap area is formed between the another separate conductor and the another conductor, wherein the another conductive layer includes a conductive pattern configured to supply a power source voltage to the another electric part and another ground conductor which is used for grounding the another electric part, wherein an area on which the another ground conductor is provided includes an area around the first through hole on the back surface, and an area around the second through hole on the back surface, and an area around the third through hole on the back surface, wherein the another ground conductor is provided with a slit formed between the first through hole and the conductive pattern on the back surface, and wherein on the back surface, the first through hole is located between the second through hole on the back surface and the third through hole on the back surface in a longitudinal direction of the slit.

10. The printed circuit board according to claim 1, further comprising:

another electric part mounted on a back surface different from the predetermined surface;

another ground conductor provided on the back surface; and a via hole electrically connecting the ground conductor on the predetermined surface and the another ground conductor on the back surface.

11. The printed circuit board according to claim 1, further comprising:

another electric part mounted on a back surface different from the predetermined surface;

another ground conductor provided on the back surface; and a via hole electrically connecting the separate conductor on the predetermined surface and the another ground conductor on the back surface.

12. The printed circuit board according to claim 1, wherein the conductive layer includes a conductive pattern configured to supply a power source voltage to the electric part, and wherein a distance from the first through hole to the conductive pattern is shorter than a distance from the second through hole to the conductive pattern.

13. The printed circuit board according to claim 1, wherein a back surface different from the predetermined surface of the printed circuit board is opposite to a frame in a state in which the printed circuit board is attached to the frame with screws.

14. The printed circuit board according to claim 1, further comprising:

another electric part mounted on a back surface different from the predetermined surface; and another conductive layer mounted on the back surface, wherein the another conductive layer includes a conductive pattern configured to supply a power source voltage to the another electric part and another ground conductor which is used for grounding the another electric part, wherein an area on which the another ground conductor is provided includes an area around the first through hole on the back surface and an area around the second through hole on the back surface, wherein the another ground conductor is provided with a slit formed between the first through hole and the conductive pattern on the back surface, and wherein the back surface different from the predetermined surface of the printed circuit board is opposite to a frame in a state in which the printed circuit board is attached to the frame with screws.

15. The printed circuit board according to claim 1, wherein a width of the gap area on the predetermined surface is 1.5 mm or more and 2.5 mm or less.

16. The image forming apparatus according to claim 3, further comprising an insulation layer that coats the conductive layer, wherein on the predetermined surface, an area around the first through hole is not coated with the insulation layer, and wherein on the predetermined surface, the area around the second through hole is not coated with the insulation layer.

17. The image forming apparatus according to claim 3, further comprising:

a third portion through which a third through hole for screw-clamping is formed;

another electric part mounted on a back surface different from the predetermined surface; and another conductive layer mounted on the back surface, wherein the conductive layer further includes another separate conductor provided around the third through hole on the predetermined surface, wherein another gap area is formed between the another separate conductor and the another conductor, wherein the another conductive layer includes a conductive pattern configured to supply a power source voltage to the another electric part and another ground conductor which is used for grounding the another electric part, wherein an area on which the another ground conductor is provided includes an area around the first through hole on the back surface, and an area around the second through hole on the back surface, and an area around the third through hole on the back surface, wherein the another ground conductor is provided with a slit formed between the first through hole and the conductive pattern on the back surface, and wherein on the back surface, the first through hole is located between the second through hole on the back surface and the third through hole on the back surface in a longitudinal direction of the slit.

18. The image forming apparatus according to claim 3, wherein a width of the gap area on the predetermined surface is 1.5 mm or more and 2.5 mm or less.

* * * * *